United States Patent [19]

Fasang

[11] 4,340,857

[45] Jul. 20, 1982

[54] DEVICE FOR TESTING DIGITAL CIRCUITS USING BUILT-IN LOGIC BLOCK OBSERVERS (BILBO'S)

[75] Inventor: Patrick P. Fasang, Mount Laurel, N.J.

[73] Assignee: Siemens Corporation, Iselin, N.J.

[21] Appl. No.: 277,992

[22] Filed: Jun. 26, 1981

Related U.S. Application Data

[63] Continuation of Ser. No. 139,207, Apr. 11, 1980, abandoned.

[51] Int. Cl.³ .............................................. G01R 15/12
[52] U.S. Cl. ..................................... 324/73 R; 371/25
[58] Field of Search ......................... 324/73 R, 73 AT; 371/25, 27

[56] References Cited

U.S. PATENT DOCUMENTS

| | | | |
|---|---|---|---|
| 3,636,443 | 1/1972 | Singh | 371/25 |
| 3,723,868 | 3/1973 | Foster | 371/25 |
| 3,761,695 | 9/1973 | Eichelberger . | |
| 3,783,254 | 1/1974 | Eichelberger . | |
| 3,784,907 | 1/1974 | Eichelberger . | |

OTHER PUBLICATIONS

In—circuit Tester using Signature Analysis Adds Digital LSI to its Range, by Craig Pynn, Electronics, May 24, 1979, pp. 153–157.

B. Koenemann et al. "Built—In Logic Block Observation Techniques", published in *Proceedings, 1979 IEEE Test Conference, Cherry Hill, New Jersey*, IEEE, New York, NY, Session 2 at pp. 37–41.

T. Williams et al., "Random Patterns Within a Structured Sequential Logic Design", published in *Proceedings, 1977 Semiconductor Test Symposium, Oct. 25–27, 1977, Cherry Hill, NJ*, IEEE, New York, NY at pp. 19–27.

*Primary Examiner*—Michael J. Tokar
*Attorney, Agent, or Firm*—Spellman, Joel & Pelton

[57] ABSTRACT

A device for testing a digital electronic circuit, having a first BILBO for generating a pseudo-random test pattern, a second BILBO for analyzing a parallel-input signature, a decoder and at least one status indicator for indicating the status of a circuit under test.

16 Claims, 9 Drawing Figures

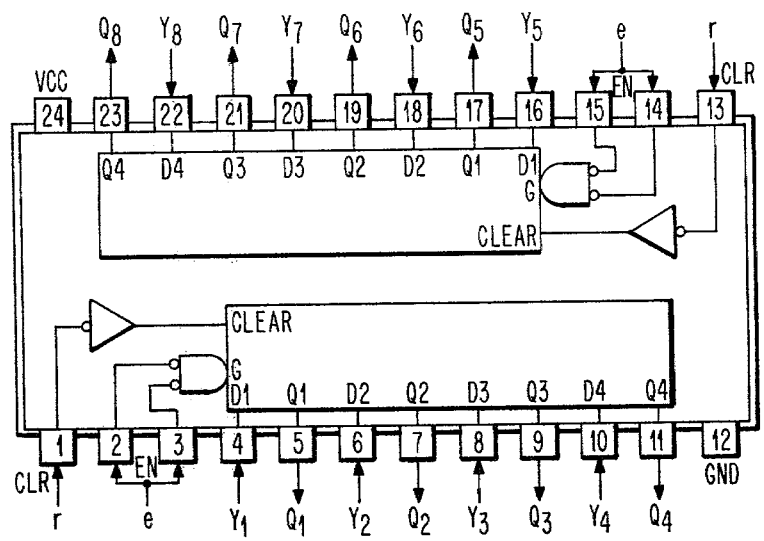
FIG. 4
FIG. 5
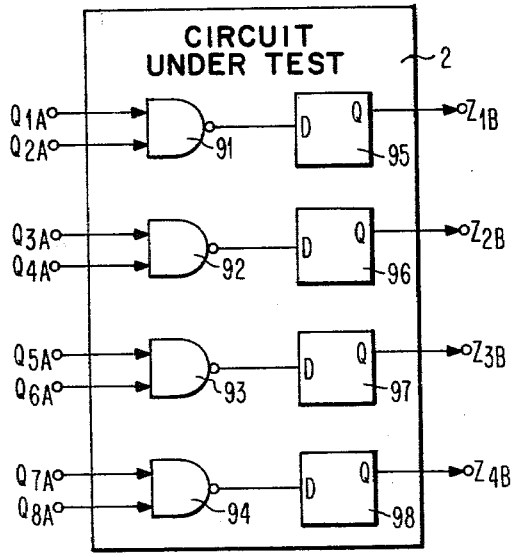
FIG. 6

DEVICE FOR TESTING DIGITAL CIRCUITS USING BUILT-IN LOGIC BLOCK OBSERVERS (BILBO'S)

This is a continuation of application Ser. No. 139,207, filed Apr. 11, 1980, and now abandoned.

BACKGROUND OF THE INVENTION

1. Field of the Invention

This invention relates to a novel and improved device for testing digital electronic circuits. Particularly, the invention relates to a device for automatically testing integrated circuits, printed circuit boards incorporating one or more integrated circuits, and even larger and more complex systems.

2. Description of the Prior Art

Testing of electronic circuits becomes more and more important as the circuits become more complex. This applies not only to integrated circuits but also to boards which usually combine several integrated circuits, or even to larger systems which combine circuit boards and a plurality of other components. Testing is required not only when the product has been manufactured, but also after it has been installed in the field. Testing of a digital circuit should be made as simple and easy as possible so that it can be performed even by the user. In such testing, it is important to determine whether or not a given digital circuit meets a required performance specification.

In recent years, testing devices have been designed for integrated circuits. The basic idea is to equip the integrated circuit under consideration with test aids supporting a self-test of the electronic product (Built-In Test).

From the "Proceedings, 1979 IEEE Test Conference", Cherry Hill, N.J., Session 2, pages 37 to 41, it is known to use the so-called "Built-In Logic Block Observation Techniques".

Testing devices according to these "Techniques" primarily deal with testing of integrated circuits. In one version (see "Proceedings", supra, FIG. 1) of the known testing device, digital circuits are tested by stimulating the inputs of the circuit under test with an appropriate sequence of input words called test patterns. The circuit under test reacts to this stimulus by issuing a sequence of output words called test data. Two steps are taken for the detection of a hardware fault in the circuit under test: First, the fault is detected at the outputs of the circuit under test. This is achieved by comparison means. When a fault is present, the test data sequence issued by the circuit under test differs from a predetermined nomimal sequence that a fault-free circuit would have issued. A preferred method for comparing the test data with the nominal data is based on cyclic coding and a tachnique known as "signature analysis". Second, the fact that the measured test data sequence does not equal to the nominal sequence is registered and transformed into a fault message by test data evaluating circuitry.

In the "Proceedings, 1979 IEEE Test Conference", supra, see FIG. 6, is also disclosed a multi-functional subsystem called a "Built-In Logic Block Observer" or "BILBO" for short. A BILBO can be used for data transfer and fault detection purposes in complex digital circuits. The BILBO is composed of a flip-flop register row and some additional gates for shifting and feedback operations. In particular, eight flip-flops are normally provided, the inputs of which are each connected to a gate combination. Each gate combination comprises a NOR gate, an Exclusive OR gate and an AND gate. Feed-back is achieved with three Exclusive OR gates. A first control input signal is applied to the first input of each of the AND gates, and a second input signal is applied to the first input of each of the NOR gates. The outputs of a NOR gate and an AND gate are connected to the inputs of an Exclusive OR gate. Input data are supplied to the second inputs of the AND gates. From the flip-flops are derived output signals and the complimented output signals.

The BILBO operates in four different modes. In the first mode, it acts as a latch. In the second mode, it works as a linear shift register. Data are serially clocked into the register while the register contents may be simultaneously read at the outputs. In the third mode, the BILBO is functionally converted into a multiple-input signature register. In this third mode, the BILBO may be used for performing parallel signature analysis. In the fourth mode, the flip-flops of the register are reset.

Two BILBO's can be used for testing a circuit in a modular bus oriented design (see "Proceedings, 1979 IEEE Test Conference," supra, FIG. 7). However, details of the connection between the BILBO's and the circuit under test are not given.

In the "Proceedings, 1977 Semiconductor Test Symposium", Oct. 25–27, 1977, Cherry Hill, pp. 19 to 27, are disclosed two concepts for designing digital circuits in connecting with testing. The first concept consists of designing such that correct operation is not dependent on live time, full time or minimum delay of the individual circuit. The only dependency is that the total delays through a number of levels is less than some known value. This technique is known as "Level Sensitive Design". The second concept consists of designing all internal storage elements (other than memory arrays) such that they can also operate as shift registers. Networks which have both of these attributes are known as "Level Sensitive Scan Designs" or "LSSD". Once a design has this structure, random test patterns can be applied to this network without regard to the sequential nature of the network. "LSSD" is an improvement of the so-called scan path techniques. Details of the scan path techniques are disclosed in U.S. Pat. Nos. 3,783,254, 3,761,695 and 3,784,907.

SUMMARY OF THE INVENTION

1. Objects of the Invention

It is an object of the present invention to provide a testing device which—according to its basic concept—is applicable not only to integrated circuits, but also to printed circuit boards as well as systems containing digital circuits, which in turn may comprise a plurality of integrated circuits.

It is another object of this invention to provide a testing device which is able to verify whether or not a given digital circuit under test meets its required performance specification.

It is another object of this invention to provide a testing device which allows for testing of a digital circuit without additional external testing equipment.

It is another object of this invention to provide a testing device which allows for a self-contained method of testing a digital circuit.

It is another object of this invention to provide a testing device which is of simple structure.

It is another object of this invention to provide a testing device which uses a plurality of one basic circuit element which forms a multifunction entity, whereby the function depends on how the element is controlled.

It is another object of this invention to provide a testing device which uses two BILBO's each of which represents a basic circuit element and forms a multifunction entity.

It is still another object of the invention to provide a testing device which comprises BILBO's and uses commercially available integrated circuits as basic building blocks in said BILBO's.

It is still another object of the invention to provide a testing device which indicates the status "fault" or "fault-free" of a digital circuit under test.

2. Summary

According to the present invention, a device for testing digital electronic circuits comprises a first Built-In Logic Block Observer (first BILBO), a second Built-In Logic Block Observer (second BILBO), a decoder, at least one status indicator and a control circuit. The first BILBO which is connected to inputs of the circuit under test is configured as a pseudo-random test pattern generator. The second BILBO which is connected to outputs of the circuit under test is configured as a parallel-input signature analyzer. The inputs of the decoder are connected to outputs of the second BILBO. The inputs of the decoder receive input signals which have a predetermined combination of logic levels when the circuit under test is fault-free and which have a combination of logic levels that is different from the predetermined combination when the circuit under test is faulty. The output of the decoder supplies a first output signal, for instance a certain analog signal or a logic 1, when the circuit under test is fault-free, and it supplies a second output signal when the circuit under test is faulty. The status indicator, connected to the output of the decoder, indicates the status "fault-free" or "faulty" of the circuit under test. The control circuit controls the first BILBO, the second BILBO and the decoder in dependence on a master clock signal which may be derived from the master clock signal of the digital circuit under test.

In operation of this testing device according to the invention, two BILBOs are connected to the circuit under test. The circuit to be tested is placed in the test mode. The first BILBO generates a pseudo-random test pattern to stimulate the circuit under test. The second BILBO receives the response data or signature from the circuit under test via a parallel-data bus and stores these data. The response data are then decoded by the decoder to verify the correctness of the performance of the circuit under test. The status indicator gives a fault-free/faulty status signal concerning the status of the circuit under test.

It should be mentioned that the known BILBO's (see "Proceedings, 1979 IEEE Test Conference," Cherry Hill, N.J., supra) can be used as first and second BILBO's with minor modifications.

The testing device according to the invention simplifies testing of complex electronic circuits including integrated circuits, bus oriented printed circuit boards and larger systems. The testing device can also be used in connection with non-bus oriented boards.

The two BILBO's along with the decoder and the status indicator, form a self-contained testing device so that a circuit to be tested can easily be tested in the field with minimal requirement of additional hardware or equipment.

As mentioned above, the second BILBO is configured as a parallel-input signature analyzer. This reduces the test time.

The foregoing and other objects, features, and advantages of the invention will be apparent from the following more particular description of preferred embodiments of the invention, as illustrated in the accompanying drawings.

BRIEF DESCRIPTION OF THE DRAWINGS

FIG. 4 is a schematic of a dual four-bit latch which can be used as a flip-flop assembly in the first and/or the second BILBO;

FIG. 5 is a function table of the dual latch of FIG. 4;

FIG. 6 is a schematic of a typical circuit under test, said circuit having four NAND gates and four flip-flops;

DESCRIPTION OF THE PREFERRED EMBODIMENTS

Figure 1:
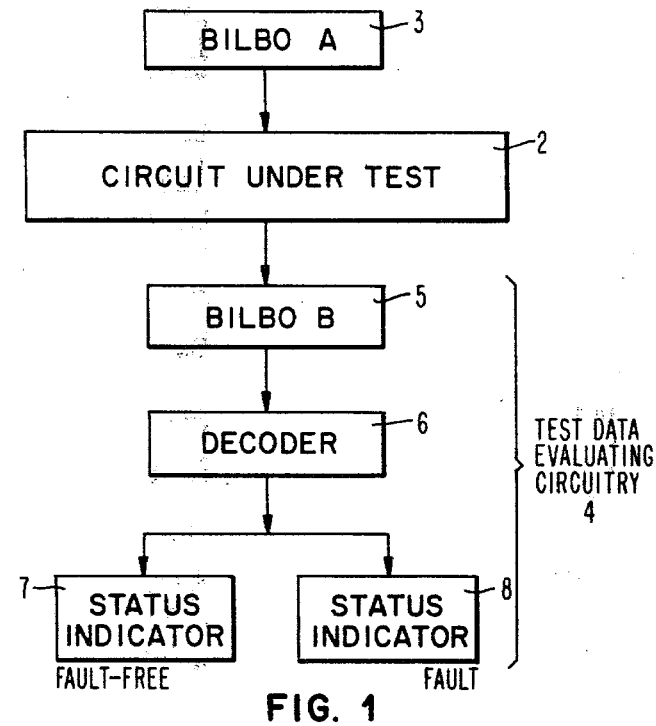
FIG. 1 is a block diagram of a testing device according to the present invention.

A block diagram of the testing device according to the invention is illustrated in FIG. 1. A digital circuit to be tested is denoted by the reference numeral 2. The digital circuit 2 may be, for instance, an integrated circuit, a printed circuit board including a plurality of components such as transistors, resistors, capacitors, or a system of printed circuit boards. The circuit under test 2 is designed in such a way that it satisfies the Level Sensitive Scan Design (LSSD) specification, as described in the literature (see, for instance, "Proceedings, 1977 Semiconductor Test Symposium", Oct. 25–27, 1977, Cherry Hill, pages 19–27). It is assumed for the sake of simplicity, that the circuit 2 does not contain any microprocessor.

Connected to the input of the circuit 2 is a first Built-In Logic Block Observer 3, which is referred to as a BILBO A. The first BILBO 3 is a specific test pattern generator, namely a pseudo-random test pattern generator, as will become apparent later.

Connected to the output of the circuit 2 is a test data evaluating circuitry 4. This circuitry 4 is comprised by a second Built-In Logic Block Observer 5, a decoder 6 and two status indicators 7 and 8 for indicating the fault-free or faulty condition of the circuit 2. The second Built-In Logic Block Observer, which is referred to as BILBO B, is configured as a parallel-input signature analyzer, as will become apparent later. The second BILBO 5 is connected to the output of the circuit 2. The input of the decoder 6 is connected to the output of the second BILBO 5. The decoder 6 drives both status indicators 7 and 8.

In testing operation, the digital circuit 2 is placed into its test mode. The first BILBO 3 generates test patterns which are sent to the circuit 2. In response to these test patterns the circuit 2 will issue test data or response data. These response data are fed into the second BILBO 5 via a parallel data bus. The output signal of the second BILBO 5 is used to drive the decoder 6 which decodes the output signal and gives a corresponding signal to the status indicators 7 and 8. Depending upon the status of the circuit 2, either status indicator 7 or status indicator 8 will be activated.

Figure 2:
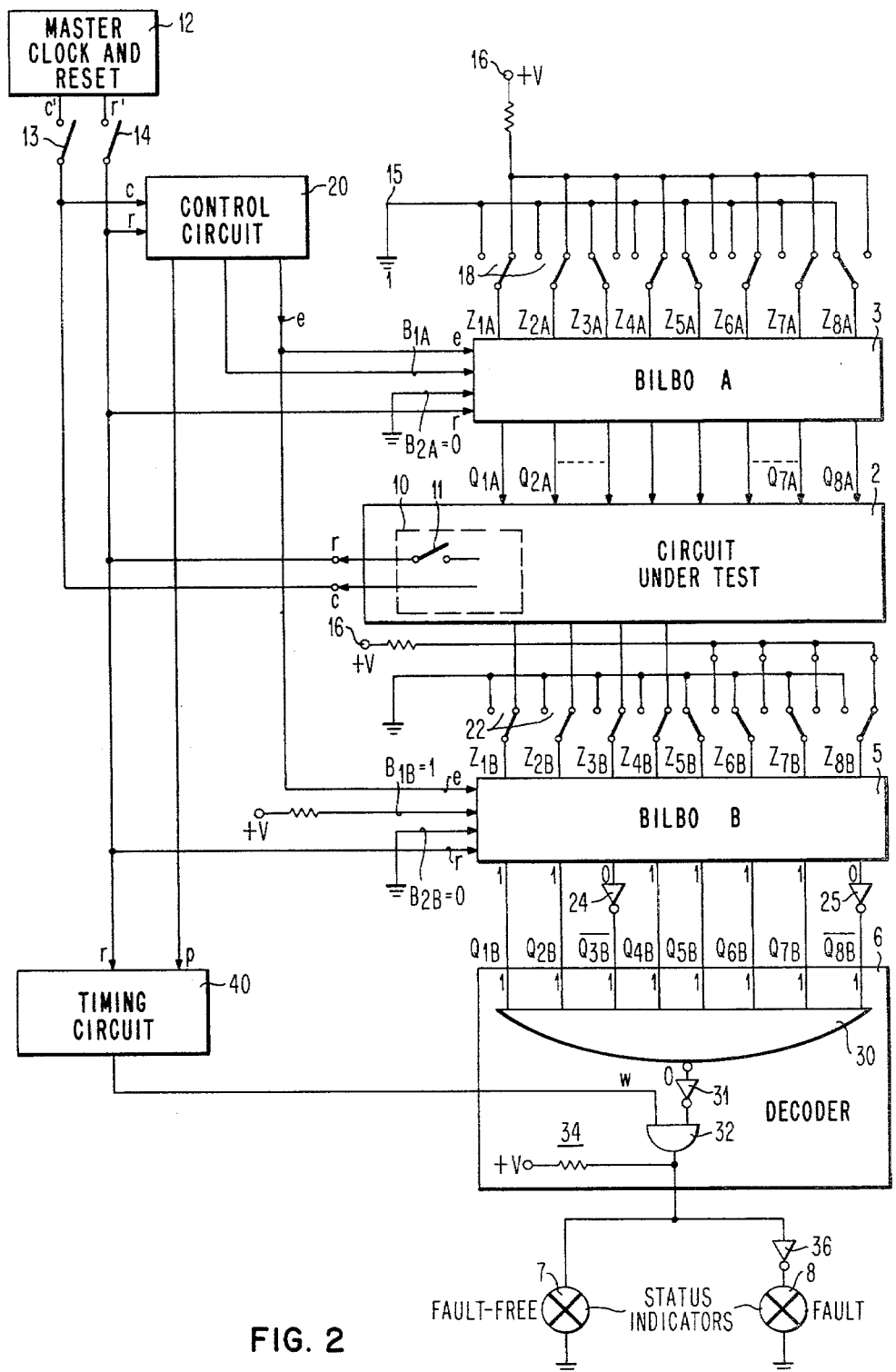
FIG. 2 is a more detailed block diagram of an embodiment of the present invention.

According to FIG. 2, the circuit 2 under test may contain a master clock and reset circuit 10. This circuit 10 develops a master clock signal c and a master reset signal r. As schematically indicated, the reset signal r can be obtained when a switch 11 is closed. This switch 11 may be operated manually. It may be, for instance, the power switch of the circuit under test 2 or a separate reset switch.

In a case where the circuit 2 under test does not have a master clock and reset circuit 10, an extra master clock and reset circuit 12 is provided. This circuit 12 may be located on the same board as the circuit 2, the first and second BILBO 3 and 5, respectively, the decoder 6, and if so desired, the status indicators 7 and 8. The master clock and reset circuit 12 delivers a master clock signal c' which is similar to the signal c, and a master reset signal r' which is similar to the signal r. The signals c' and r' may be supplied to the testing device via switches 13 and 14, respectively. The switch 14 may be a manual reset switch.

In the embodiment of FIG. 2 it is assumed that the first BILBO 3 is an 8 bit BILBO. Thus, the first BILBO 3 has eight inputs which are supplied by input signals $z_{1A}, z_{2A}, \ldots z_{8A}$. It should be pointed out, however, that a BILBO 3 with a number of inputs other than 8 can be used, that is the number of bits may be selected to suit the circuit to be tested.

As illustrated in FIG. 2, the inputs 3, 5, and 8 of BILBO 3 are connected to ground 15, whereas the inputs 1, 2, 4, 6 and 7 are connected via a resistor to a voltage source having the voltage $+V$. Thus the 8 inputs are divided into a first and a second group, respectively. The connection either to ground 15 or to the voltage $+V$ is made via switches which generally are referred to as 18. The connection to ground 15 corresponds to an input signal representing a logic 0, and the connection to the voltage $+V$ corresponds to an input signal representing a logic 1. By setting the switches 18, the first group of inputs is supplied with input signals representing a logic 1 and the second group of inputs is supplied with input signals representing a logic 0. The selection of both groups depends on the structure of the circuit 2 under test.

Setting of the switches 18 can be performed either manually or controlled by a computer program. In a preferred embodiment, however, the switches 18 are left away altogether, and the connection is permanently wired.

In addition to the input signals $z_{1A}, z_{2A}, \ldots z_{8A}$, the first BILBO 3 receives four other signals $B_{1A}, B_{2A}$, e and r. The signals $B_{1A}$ and $B_{2A}$ are control signals. The first control signal $B_{1A}$ is issued by a control circuit 20. It corresponds either to a logic 0 or a logic 1. The second control signal $B_{2A}$ corresponds to a logic 0. The corresponding control input is connected to ground. The signal e, which is an enabling signal, is also derived from control circuit 20. It is also supplied to the second BILBO 5. The fourth additional signal which the first BILBO 3 receives is the master reset signal r. The first BILBO 3 has 8 outputs (for example) which are connected to the circuit 2 under test. The output signals are denoted as $Q_{1A}, Q_{2A}, \ldots Q_{7A}, Q_{8A}$.

The second BILBO 5 also has eight inputs in the embodiment shown in FIG. 2. The input signals are denoted as $z_{1B}, z_{2B}, \ldots z_{7B}, z_{8B}$. Thus, the second BILBO 5 receives input signals of 8 bits. In other modifications, the second BILBO 5 could have a different number of bits, for instance 4 or 16. The eight inputs are divided into three groups. The first group, which comprises the first four inputs 1 to 4, is connected via switches to four outputs of the circuit 2. A second group of inputs is connected via switches to ground, thus providing input signals which equal to a logic 0. The second group comprises the inputs 5, 6, and 7. The input 8, wich represents the third group, is connected via another switch and a resistor to a voltage source 16 having the voltage $+V$, thus providing for an input signal $z_{8B}=1$. The switches by which a selection can be made are generally referred to as 22.

The selection of the three groups and the connection of the inputs either to the circuit 2 or to ground or to the voltage source 16 depends on the structure of the circuit 2 under test. It should also be mentioned that the switches 22 can be actuated either manually or by control of a computer program. In a preferred embodiment, however, the switches 22 are left away altogether, and the connection to the outputs of the circuit 2, to ground and to the voltage source 16 is hardwired.

In addition to the input signals $z_{1B}, z_{2B}, \ldots z_{8B}$, the second BILBO 5 receives four input signals $B_{1B}, B_{2B}$, e and r. Two of these signals are control signals $B_{1B}$ and $B_{2B}$. In order to configure the second BILBO 5 as a parallel-input signature analyzer, the input signals are chosen to be $B_{1B}=1$ and $B_{2B}=0$. The first control input is connected to a voltage source having a voltage $+V$, and the second control input is connected to ground. The other two signals are the enabling signal e from the control circuit 20 and the master reset signal r.

The second BILBO 5 also has eight outputs. It is assumed in the example illustrated that the eight bit output signal is the combination 11011110 of the logic levels 0 and 1. It is further assumed that the combination 110011110 of logic levels corresponds to a predetermined combination which will prevail when the circuit 2 under test is fault-free.

In order to obtain an input combination 11111111 consisting only of logic 1's on the input of the following decoder 6, two inverters 24 and 25 are connected between the third output of the second BILBO 5 and the third input of the decoder 6, and between the eighth output of the second BILBO 5 and the eighth input of the decoder 6, respectively. The input signals supplied to the decoder 6 are denoted as $Q_{1B}, Q_{2B}, \overline{Q_{3B}}, Q_{4B}, Q_{5B}, Q_{6B}, Q_{7B}, \overline{Q_{8B}}$. The inverters 24 and 25 may be part of the decoder 6.

It should be noted that the output signals on the outputs of the second BILBO 5 have a combination of logic levels which is different from the predetermined combination 11011110 when the circuit 2 under test is faulty. In such a case, the input signals of the decoder 6 do not have all the same logic level 1. At least one of them will be a logic 0.

The decoder 6 comprises a summing member 30, an inverter 31, a blocking member 32 and a pull-up device 34. The summing member 30 is designed as a NAND gate having eight inputs. The input signals of the decoder 6 are applied to the eight inputs of the member 30.

The output of the summing member 30 is connected via the inverter 3 to the first input of the blocking member 32. The blocking member 32 is designed as an AND gate. The second input of the blocking member 32 receives an "end-of-window signal" or "end-of-test signal", which is designated as w. The output of the blocking member 32 is the output of the decoder 6. To this output is connected the pull-up member 34. The pull-up member 34 comprises a resistor which is fed by a voltage source having the voltage $+V$. The pull-up member 34 serves to drive the status indicators 7 and 8, since the output signals of the NAND gate 32 may be too weak to supply LEDs which may be used as status indicators 7 and/or 8.

As is apparent from FIG. 2, the NAND gate 30 will issue a logic 0 if all eight input signals equal 1, and an output signal 1 if at least one of the eight input signals equals 0. Therefore, the output signal of the inverter 31 will be a logic 1, when the circuit under test is fault-free. The output signal 0 of the NAND gate 30 will result in an output signal 1 (=fault-free output signal) of the decoder 6 only if the end-of-test signal w equals a logic 1. As will be seen later in FIG. 9, this will happen at the end of a test period when the last pulse of a chain of pulses is generated. During the generation time of the preceding pulses of the chain, the signal w equals a logic 0, and therefore the output signal of the decoder 6 will be zero.

In principle, the NAND gate 30, inverter 31 and blocking member 32 represent a 9 bit AND gate. Such a 9 bit AND gate can also be assembled in different ways than illustrated in FIG. 2.

The output signal of the decoder 6 is fed to the first status indicator 7 directly and to the second status indicator 8 via an inverter 36. Thus the first status indicator 7 will be active in the fault-free status, while the second status indicator 8 will be inactive, and the first status indicator 7 will be inactive in the faulty status, while the second status indicator will be active.

Status indicators 7 and 8 may use any optical, audio or mechanical indicator, for instance, an LED, a buzzer or a flag.

As indicated earlier, the control circuit 20 receives as input signals the master clock signal c and the master reset signal r (or corresponding signals r' and c'). The control circuit 20 delivers the enabling signal e, the first control signal $B_{1A}$ of the first BILBO 3 and timing pulses p. These timing pulses p are fed to a timing circuit 40. The timing circuit 40 also receives the master reset signal r. It delivers as an output signal the end-of-test signal w.

Figure 3:
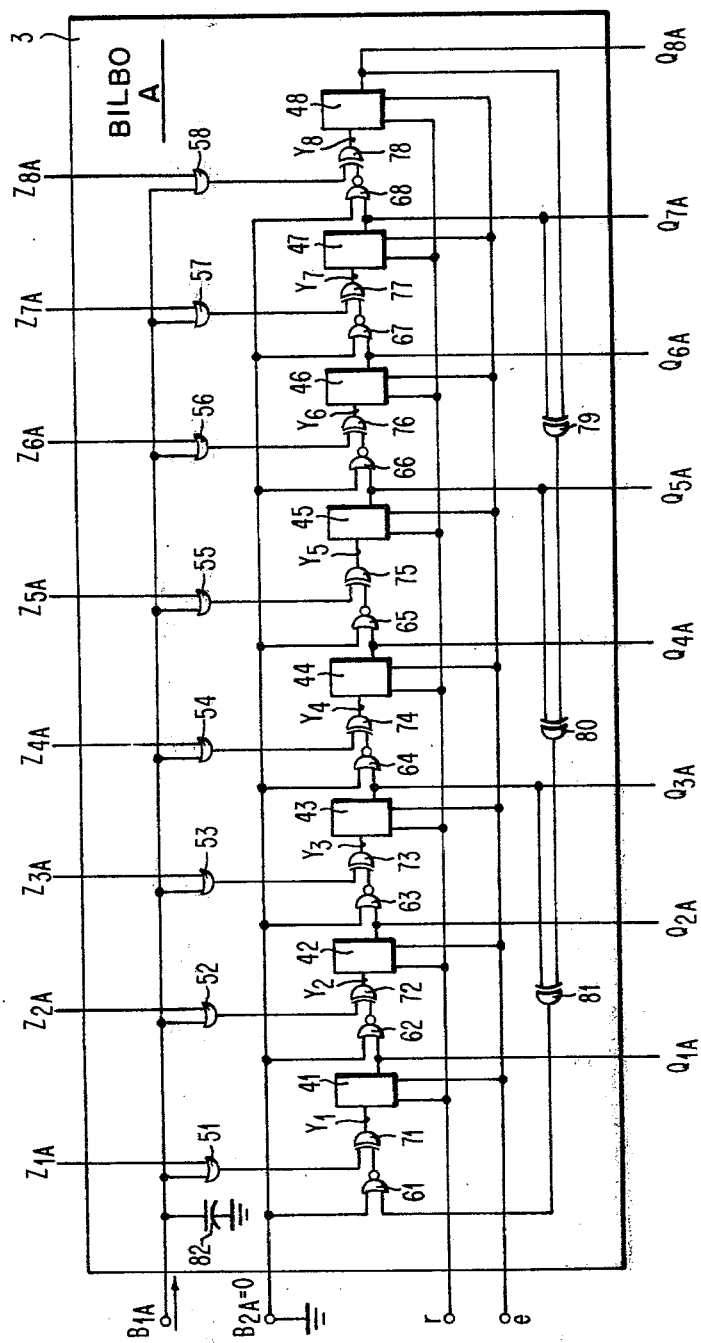
FIG. 3 is a schematic of an embodiment of the first BILBO, which is configured as a pseudo-random test pattern generator.

In FIG. 3 is illustrated an embodiment of the first BILBO 3. This embodiment is essentially designed like the BILBO disclosed in "Proceedings, 1979 IEEE Test Conference", supra. It should be noted, however, that a multiplexer is not needed. In particular, the first BILBO 3 contains eight storage elements such as flip-flops 41–48, eight AND gates 51–58, eight NOR gates 61–68, eight Exclusive OR gates 71–78, and three additional OR gates 79, 80 and 81 in the feedback loop. In order to stretch the pulses of the first control signal $B_{1A}$, there is provided a capacitor 82 in parallel to the first control input.

More particularly, the first BILBO comprises eight modules or groups which are connected in series or in a row. Each group consists of a storage element and a gate combination to permit the output of one storage element to be applied to the input of another. In the embodiment shown, the gate combination consists of an AND gate, a NOR gate and an Exclusive OR gate. For instance, the fourth group consists of the fourth flip-flop 44, the fourth AND gate 54, the fourth NOR gate 64 and the fourth Exclusive OR gate 74. The first input of the fourth NOR gate 64 is connected to the output of the third flip-flop 43. To the second input of the fourth NOR gate 64 is connected the second control signal $B_{2A}=0$. The fourth Exclusive OR gate 74, has a first input connected to the output of the fourth NOR gate 64 and a second input connected to the output of the fourth AND gate 54. The output of the OR gate 74 is connected to the fourth flip-flop 44. The fourth AND gate 54 is fed by the first control signal $B_{1A}$ and the fourth input signal $z_{4A}$. The output of the fourth flip-flop 44 issues the output signal $Q_{4A}$ which is fed to the fourth output of the first BILBO 3. The signal $Q_{4A}$ is also connected to the first input of the NOR gate 65 of the next group. The other groups have the same structure as the fourth group.

In the present embodiment of the first BILBO 3 the feedback loop is connected with its output to the first input of the first NOR gate 61. The additional Exclusive OR gate 79 is fed by the output signals $Q_{7A}$ and $Q_{8A}$ of the seventh and the eighth flip-flop 47 and 48, respectively. The additional Exclusive OR gate 80 is fed by the output signal $Q_{5A}$ of the fifth flip-flop 45 and the output signal of the Exclusive OR gate 79. The Exclusive OR gate 81, which is the last gate in the feed-back loop, is fed by the output signal $Q_{3A}$ of the third flip-flop 43 and the output signal of the Exclusive OR gate 80. The output of the Exclusive OR gate 81 is the output of the feedback loop.

The eight flip-flops 41–48 receive as input signals also the master reset signal r and the enabling signal e.

Due to the control signals $B_{1A}$ and $B_{2A}$ ($B_{2A}=0$), the first BILBO 3 is configured as a linear shift register. The function of the first BILBO 3 is to generate a pseudo-random test pattern. In the present embodiment, the maximum period of the test pattern corresponds to 255 pulses of the master clock signal c. The pseudo-random test pattern is obtained from the eight outputs of the BILBO 3 as output signals $Q_{1A}, Q_{2A}, \ldots Q_{8A}$.

Only for the purpose of giving an example, not for the purpose of limitation of the scope of the invention, it may be mentioned that the AND gates 51–58 may be of the type 7408, the NOR gates 61–68 of the type 7402, the Exclusive OR gates 71–81 of the type 7486 of Texas Instruments Incorporated, Dallas, Tex.

Also for the sake of giving an example, not for limiting the scope of the invention, it may be mentioned that the eight flip-flops 41–48 may be assembled in a single standard circuit, for instance the type 74116 "Dual 4-Bit Latches with Clear" by Texas Instruments. Details of such a standard circuit are shown in FIG. 4 and the corresponding function table is presented in FIG. 5.

In the standard circuit of FIG. 4, the input signals and the output signals are shown with a first index, but without a second index. The reason for this is that the standard circuit of FIG. 4 can also be used to implement the chain of flip-flops in the second BILBO 5. Therefore, FIGS. 4 and 5 could be used as the basis of the implementation of the second BILBO 5, also.

The input signals of the eight flip-flops are denoted as $y_1, y_2, \ldots y_8$. The output signals are denoted as $Q_1, Q_2, \ldots Q_8$. The clear or reset signal is r, and the enabling signal is e. The numbers in the boxes denote the pin numbers of the particular chip. In the function table of FIG. 5, H indicates a high level, L a low level, X irrelevant, and $Q_0$ the level of the signal Q before the particular input conditions were established.

In FIG. 6 is illustrated an arbitarily chosen example of the circuit 2 under test. This specific circuit 2 contains four NAND gates 91–94 and four flip-flops 95–98. It is assumed that the first NAND gate 91 receives the two input signals $Q_{1A}$ and $Q_{2A}$ from the first BILBO 3. The output of the first NAND gate 91 is connected to the input of the first flip-flop 95. The output of the first flip-flop 95 delivers the first output signal $z_{1B}$. A corresponding configuration is chosen for the other combinations of NAND gates and flip-flops.

In the normal working mode, the input signals $Q_{1A}$ through $Q_{8A}$ may be disconnected from the circuit 2 and/or connected to other components (not shown in FIG. 6). That means that in the normal working mode the stimulus for the circuit 2 under test may come from elsewhere. The circuit 2 under test is set into the test mode by switches (not shown). As illustrated in FIG. 6, the output signals $Q_{1A}, \ldots Q_{8A}$ are applied to the inputs of the four NAND gates 91–94, and the output signals $z_{1B}$–$z_{4B}$ of the flip-flops 95–98 are fed to the first four inputs of the second BILBO 5. Instead, the flip-flops 95–98 can be used to form a part of either the first BILBO 3 or the second BILBO 5.

It should also be pointed out that the circuit 2 in FIG. 6 is partitioned according to the LSSD specification (supra). Specifically, it is partitioned into two parts. One part contains the four NAND gates 91–94, and the other part contains the flip-flops 95–98.

Figure 7:
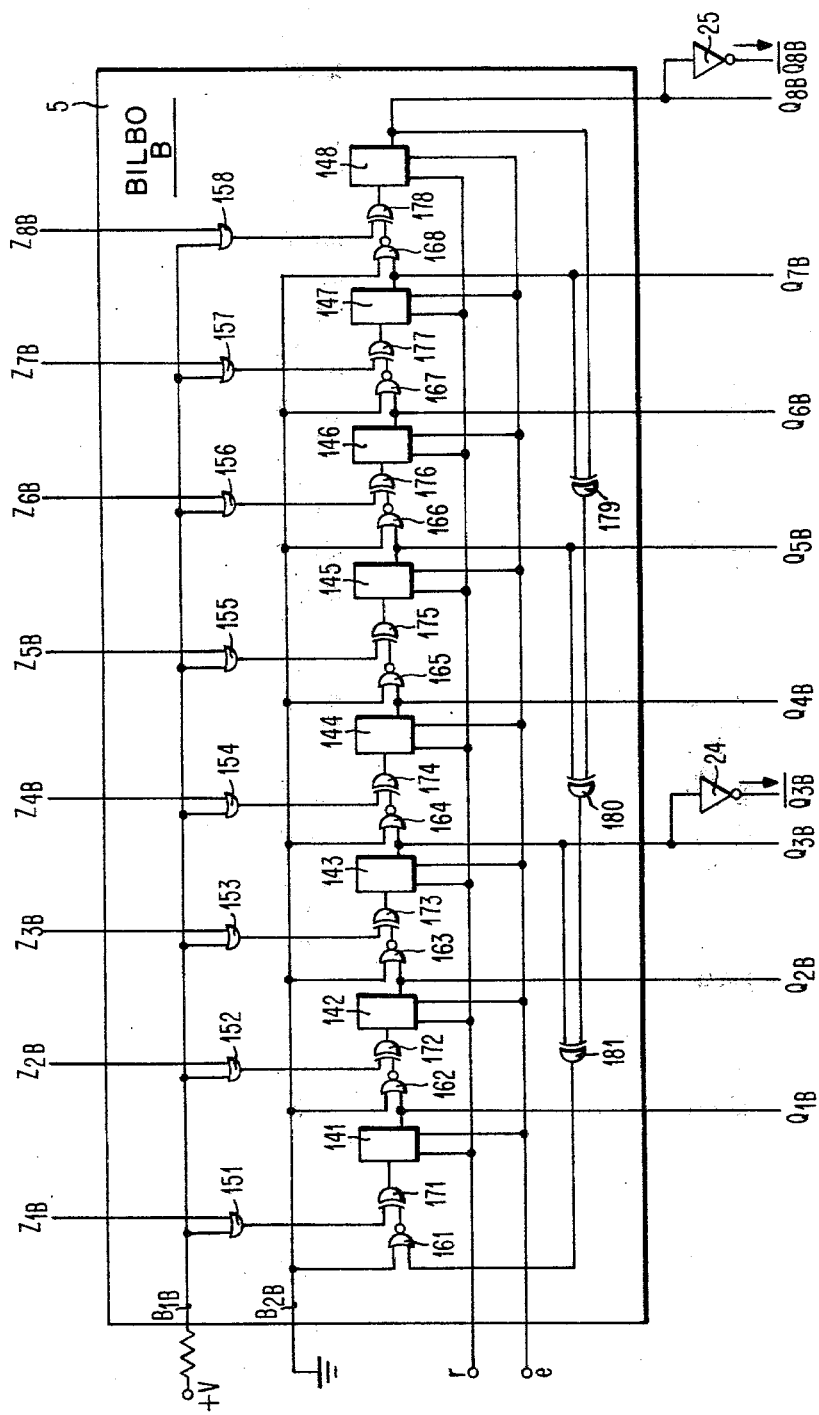
FIG. 7 is a schematic of an embodiment of the second BILBO.

In FIG. 7 an embodiment of the second BILBO 5 is illustrated. The hardware design of the second BILBO 5 is the same as the hardware design of the first BILBO 3 in FIG. 3.

Therefore, elements corresponding to elements in FIG. 3 are designated with the same reference numeral with addition of a 1 at the beginning. The BILBO 5 contains eight flip-flops 141–148, eight AND gates 151–158, eight NOR gates 161–168, eight Exclusive OR gates 171–178, and three additional Exclusive OR gates 179–181 in the feedback loop. A detailed description of the circuitry does not seem to be necessary.

As can be seen in FIG. 7, the first control signal $B_{1B}$ is chosen to be $B_{1B}=1$, and the second control signal $B_{2B}$ is chosen to be $B_{2B}=0$. For this purpose, the first control input is connected to a voltage source having the voltage $+V$, whereas the second control input is connected to ground.

Due to the selection of the control signals $B_{1B}$ and $B_{2B}$, the second BILBO 5 is configured as a parallel input signature analyzer. The function of this second BILBO 5 is to capture the test data represented by the four signals $z_{1B}$, $z_{2B}$, $z_{3B}$ and $z_{4B}$ at the output of the circuit 2. In addition, the second BILBO 5 receives the four input signals $z_{5B}, \ldots z_{8B}$, which are either a logical 1 or a logical 0.

It should again be noted that the second BILBO 5 is identical to the first BILBO 3 in FIG. 3, with the exception of the way the first control signal $B_{1B}$ is enabled. Here, the first input is permanently connected to a power supply having the voltage $+V$ via a resistor, whereas in FIG. 3 the first control input is connected to the output of the control circuit 20. It should also be noted that a standard circuit according to FIGS. 4 and 5 can be used as flip-flops 141–148.

As discussed earlier with regard to FIG. 2, the output signals $Q_{1B}, \ldots Q_{8B}$ are supplied to the inputs of the decoder 6. The function of the decoder 6 (see FIG. 2) connected to the second BILBO 5 is to decide whether or not the test data captured by the second BILBO 5 are the correct data. If so, the decoder 6 gives out a logic 1 value. If not, it gives out a logic 0 value. Depending on the test pattern used as well as on the specific circuit 2, some of the values of the signals $Q_{1B}$–$Q_{8B}$ of the second BILBO 5 may need to be inverted to allow the decoder 6 to function as desired. In FIG. 7, the third and the eighth output signals are inverted by the inverters 24 and 25, respectively.

Figure 8:
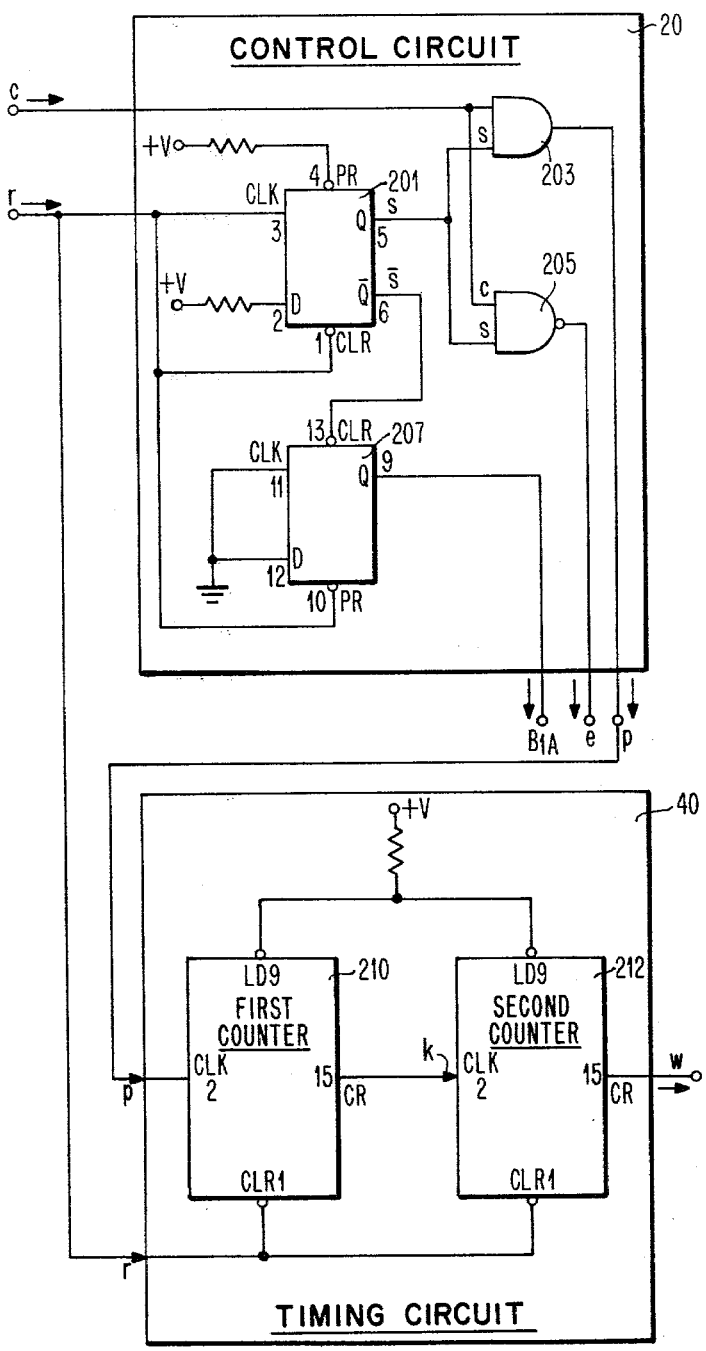
FIG. 8 is a schematic of an embodiment of a control circuit in conjunction with a timing circuit.

In FIG. 8, an embodiment of the control circuit 20 and of the timing circuit 40 is illustrated. The control circuit 20 contains a first flip-flop 201, and AND gate 203, a NAND gate 205, and a second flip-flop 207. The master reset signal r is applied to the clock input CLK and the clear input CLR of the first flip-flop 201. The data input D and the reset input PR of the first flip-flop 201 are connected via resistors to the voltage source $+V$. The output of the first flip-flop 201 is connected to one input of the AND gate 203. To the other input of the AND gate 203 is supplied the master clock signal c. The output signal of the first flip-flop 201 is a counter enable signal s̄. The complimented output signal s of the first flip-flop 201 is connected to the clear input CLR of the second flip-flop 207. The clock input CLK and the data input D of the second flip-flop 207 are connected to ground, whereas the reset input PR is fed by the master reset signal r. The output signal of the second flip-flop 207 is the first control signal $B_{1A}$.

Connected to the NOR gate 205 are the counter enable signal s and the master clock signal c. The output signal of the NOR gate 205 is the enable signal e.

In the control circuit 20, there may be used the first part of a dual flip-flop model 7474 as the first flip-flop 201 and the second part as the second flip-flop 207, a model 7408 as the AND gate 203, and a model 7400 as the NOR gate 205. The model numbers refer to part numbers of Texas Instruments.

The timing circuit 40 includes a first counter 210 and a second counter 212. Both counters 210 and 212 are each designed to count from 0 to 16. Having reached 16, they will go back to 0. After sixteen pulses, a carry signal k pulse will be developed at the cary output CR of the first counter 210. In the combination known, they will count from 0 to 255, and then go back to 0 again.

As will be noted, the load inputs LD of both counters 210 and 212 are connected via a common resistor to a voltage source having the voltage $+V$. Their clear inputs CLR are fed by the master reset signal r. The carry output CR of the first counter 210 is connected to the clock input CLK of the second counter 212. The timing pulse signal p from the control circuit 20 is applied to the clock input CLK of the first counter 210. The carry output CR of the second counter 212 is the output of the timing circuit 40. It delivers the end-of-test signal w.

In operation, the timing circuit 40 counts from 0 to 255, that is until 255 pulses of the master clock signal c are reached, issues then an end-of-test pulse as the output signal w, and return to its initial state 0.

Each of the counters 210 and 212 may be, for instance, the type 74171 of Texas Instruments.

Figure 9:
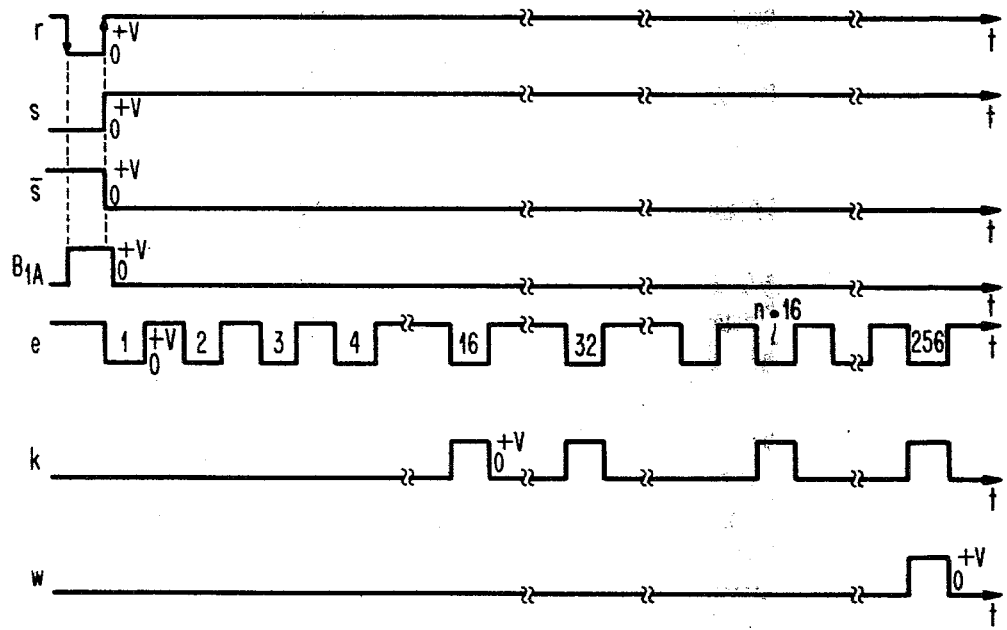
FIG. 9 is a timing diagram related to FIGS. 2 through 8.

In FIG. 9 various timing diagrams concerning the testing device of FIG. 2 are shown. On the basis these timing diagrams the sequence of operations in testing the circuit 2 shall be described.

When starting the operation, the entire testing device—that is, the circuit 2, the BILBOs 3 and 5, and the decoder 6—are reset by aid of the master reset signal r. This can be done by closing the switch 11 (see FIG. 2).

The master reset signal r—a pluse with a trailing first edge and a rising second edge—is shown in the first line of FIG. 9. Due to this pulse, a pulse in the first control signal $B_{1A}$ is created, as shown in the fourth line of FIG. 9. At the rising edge of the pulse of the master reset signal r, the counter enable signal s (see second line in FIG. 9) goes high to achieve the value of a logic 1. When the counter enable signal $\bar{s}$ (see second line in FIG. 9) goes high, the inverted signal s (see third line in FIG. 9) goes low. Due to the capacitor 82, the trailing edge of the first control signal $B_{1A}$ extends beyond the rising edge of the master reset pulse. The pulse of the control signal $B_{1A}$ will result in loading the predetermined values $z_{1A}, z_{2A}, \ldots z_{8A}$ (see FIG. 2) into the flip-flops 41–48 of the first BILBO 3. At the end of the loading pulse, the control or loading signal $B_{1A}$ of the first BILBO 3 will achieve the value of a logic 0.

The enable signal e is created, starting with the rising edge of the master reset signal r. This enable signal e consists of a row of pulses which are marked with the numbers 1, 2, 3, 4, ... 16, ... 32, ... (n·16) ..., 256. The signal e shifts the contents of the first and second BILBO 3 and 5 repeatedly in a feedback fashion until the end of the test is reached. When pulse number 16 occurs, a pulse in the carry signal k is created (see sixth line in FIG. 9). This pulse and the following fifteen pulses are counted in the second counter 212. In other words, with each pulse having the number 16, 32, ... (n·16) ... in the enable signal e, one pulse in the carry signal k is created. This goes on until the pulse having the number 256 in the enable signal e is reached. Now a pulse is produced in the output signal w (=end-of-test signal) of the timing circuit 40, as will be seen in the last line of FIG. 9. This pulse is applied to the NAND gate 32 and the decoder 6. During the pulse time of the pulse in the signal w, a status signal is transferred from the NAND gate 30 to the status indicators 7 and 8. Due to the enabling signal e, the initial input information $z_{1A} \ldots z_{8A}$ is shifted around the row of flip-flops 41–48 for a total of 256/16 = 32 times. During these 32 cycles the circuit 2 under test will receive 256 different input configurations $Q_{1A} \ldots Q_{8A}$ from the first BILBO 3. The circuit 2 in turn will issue $2^4 = 16$ different output configurations $z_{1B} \ldots z_{4B}$. These data together with the permanent information $z_{5B} \ldots z_{8B}$ will be shifted around in the second BILBO 5 also 32 times, due to the enabling signal e. Therefore at the output of the second BILBO 5, 256 different output combinations $Q_{1B} \ldots Q_{8B}$ may occur. Only the last combination, corresponding to pulse number 256 in the enabling signal e, is used in the decoder 6 for error checking. In other words, the input information $z_{1A} \ldots z_{8A}$ is processed by the first BILBO 3, by the circuit 2 and by the second BILBO 5 in the course of 255 subsequent pulses, and only when the last pulse of the row occurs, the output of the decoder 6 and thereby the function or malfunction of the circuit 2 is investigated.

There has thus been shown and described a novel testing device which fulfills all the objects and advantages sought therefore. Many changes, modifications, variations and other uses and applications of the subject invention will, however, become apparent to those skilled in the art after considering this specifications and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A device for testing a digital electronic circuit, comprising in combination:
    (a) first BILBO means for generating a pseudo-random test pattern, said first BILBO means being connected to inputs of said circuit under test and having a serially connected chain of storage elements and input modifying means connecting the output of at least one storage element to the input of another;
    (b) second BILBO means for analyzing a parallel-input signature, said second BILBO means being connected to outputs of said circuit under test and having a serially connected chain of storage elements and input modifying means connecting the output of at least one storage element to the input of another;
    (c) a decoder having:
        (ca) inputs connected to outputs of said second BILBO means for receiving input signals having a predetermined combination of logic levels when said circuit under test is fault-free and having a combination of logic levels different from the predetermined combination when the circuit under test is faulty; and
        (cb) an output for delivering a first output signal when said circuit under test is fault-free and for delivering a second output signal when said circuit under test is faulty;
    (d) at least one status indicator connected to the output of said decoder for indicating the status of said circuit under test; and
    (e) means for controlling said first and second BILBO means and said decoder in dependence on a master clock signal.

2. The testing device according to claim 1, wherein said first BILBO means comprises a plurality of inputs divided into a first group and into a second group, and wherein first input signals representing a logic 0 are supplied to said first group and wherein second input signals representing a logic 1 are supplied to said second group of inputs.

3. The testing device according to claim 1, wherein said second BILBO means comprises a plurality of inputs, a first combination of which are connected to outputs of said circuit under test and a second combination of which are supplied by input signals representing a first logic level.

4. The testing device according to claim 3, wherein a third combination of inputs of said second BILBO means is supplied by input signals representing a second logic level.

5. The testing device according to claim 1, wherein the outputs of said second BILBO means are non-complemented outputs, wherein the output signals of these non-complemented outputs have a predetermined combination of logic levels when said circuit under test is fault-free and a combination of logic levels different from said predetermined combination when said circuit under test is faulty, wherein each of a first group of the outputs of said second BILBO means is connected to an invertor, said first group having as output signals a first logic level when said circuit under test is fault-free, and wherein the outputs of said inverters and a second group of the outputs of said second BILBO means are connected to the inputs of said decoder, each of said second group having a second logic level when said circuit under test is fault-free.

6. The testing device according to claim 5, wherein the inputs of said decoder are the inputs of a summing member, the input signals of which having all the same logic level when said circuit under test is in a fault-free condition.

7. The testing device according to claim 6, wherein said summing member is a NAND gate.

8. The testing device according to claim 1, wherein said decoder has an output for delivering an output signal having a first logic level when said circuit under test is fault-free and having a second logic level when said circuit under test is faulty.

9. The testing device according to claim 1, wherein said master clock signal is derived from said circuit under test.

10. The testing device according to claim 1, wherein said master clock signal is derived from a master clock circuitry which is provided in addition to said circuit under test.

11. The testing device according to claim 1, wherein said control means includes a control circuit and a timing circuit which is controlled by timing pulses of said control circuit, said timing circuit delivering an output signal to said decoder after a predetermined number of clock pulses of said master clock signal, said output signal indicating the end of a test of said circuit under test.

12. The testing device according to claim 11, wherein the output of said timing circuit is applied to a blocking member in said decoder for releasing the output signal of said decoder to said status indicator.

13. The testing device according to claim 12, wherein said blocking member is an AND gate.

14. The testing device according to claim 11, wherein said timing circuit includes at least one counter.

15. The testing device according to claim 1, wherein the control circuit forms an enabling signal for driving said first and said second BILBO means, said enabling signal being comprised of a chain of pulses having a predetermined number, and wherein said control circuit also forms an end of test pulse at the last pulse of said chain of pulses, said end of test pulse being supplied to a blocking member for releasing the information which is just present in said decoder to said status indicator.

16. The testing device according to claim 15, wherein said chain of pulses has a predetermined number of 256 pulses.

* * * * *